United States Patent
Mishra et al.

(10) Patent No.: US 8,178,417 B2
(45) Date of Patent: May 15, 2012

(54) METHOD OF FORMING SHALLOW TRENCH ISOLATION STRUCTURES FOR INTEGRATED CIRCUITS

(75) Inventors: Shailendra Mishra, Singapore (SG); James Yong Meng Lee, Singapore (SG); Zhao Lun, Singapore (SG); Wen Zhi Gao, Singapore (SG); Chung Woh Lai, Singapore (SG); Huang Liu, Singapore (SG); Johnny Widodo, Singapore (SG); Liang Choo Hsia, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 353 days.

(21) Appl. No.: 12/107,751

(22) Filed: Apr. 22, 2008

(65) Prior Publication Data

US 2009/0261448 A1   Oct. 22, 2009

(51) Int. Cl.
*H01L 21/76* (2006.01)

(52) U.S. Cl. ................ 438/424; 257/E21.545

(58) Field of Classification Search .......... 438/424; 257/E21.545, 546
See application file for complete search history.

(56) References Cited

U.S. PATENT DOCUMENTS

| | | | | |
|---|---|---|---|---|
| 5,320,981 A * | 6/1994 | Blalock | | 438/640 |
| 5,629,237 A * | 5/1997 | Wang et al. | | 438/701 |
| 5,746,884 A * | 5/1998 | Gupta et al. | | 438/640 |
| 6,274,457 B1 * | 8/2001 | Sakai et al. | | 438/424 |
| 6,444,574 B1 * | 9/2002 | Chu | | 438/638 |
| 6,893,938 B2 | 5/2005 | Naeem et al. | | |
| 7,238,609 B2 * | 7/2007 | Ito | | 438/640 |
| 2002/0098662 A1 * | 7/2002 | Li | | 438/424 |

* cited by examiner

*Primary Examiner* — William D Coleman
(74) *Attorney, Agent, or Firm* — Horizon IP Pte Ltd

(57) ABSTRACT

A method of forming shallow trench isolation (STI) structures using a multi-step etch process is disclosed. The first etch step is performed by selectively etching the substrate at a substantially higher etching rate than the mask layer to form preliminary openings having steep taper angles. The second etch step is performed by non-selectively etching the substrate to deepen the preliminary openings to form STI gaps with substantially flat bottoms.

23 Claims, 10 Drawing Sheets

| Taper Angle (Deg) | Bottom of STI (nm) |
|---|---|
| 87.5 | 45 |
| 86 | 30 |
| 84.5 | 15 |
| 83 | 0 |

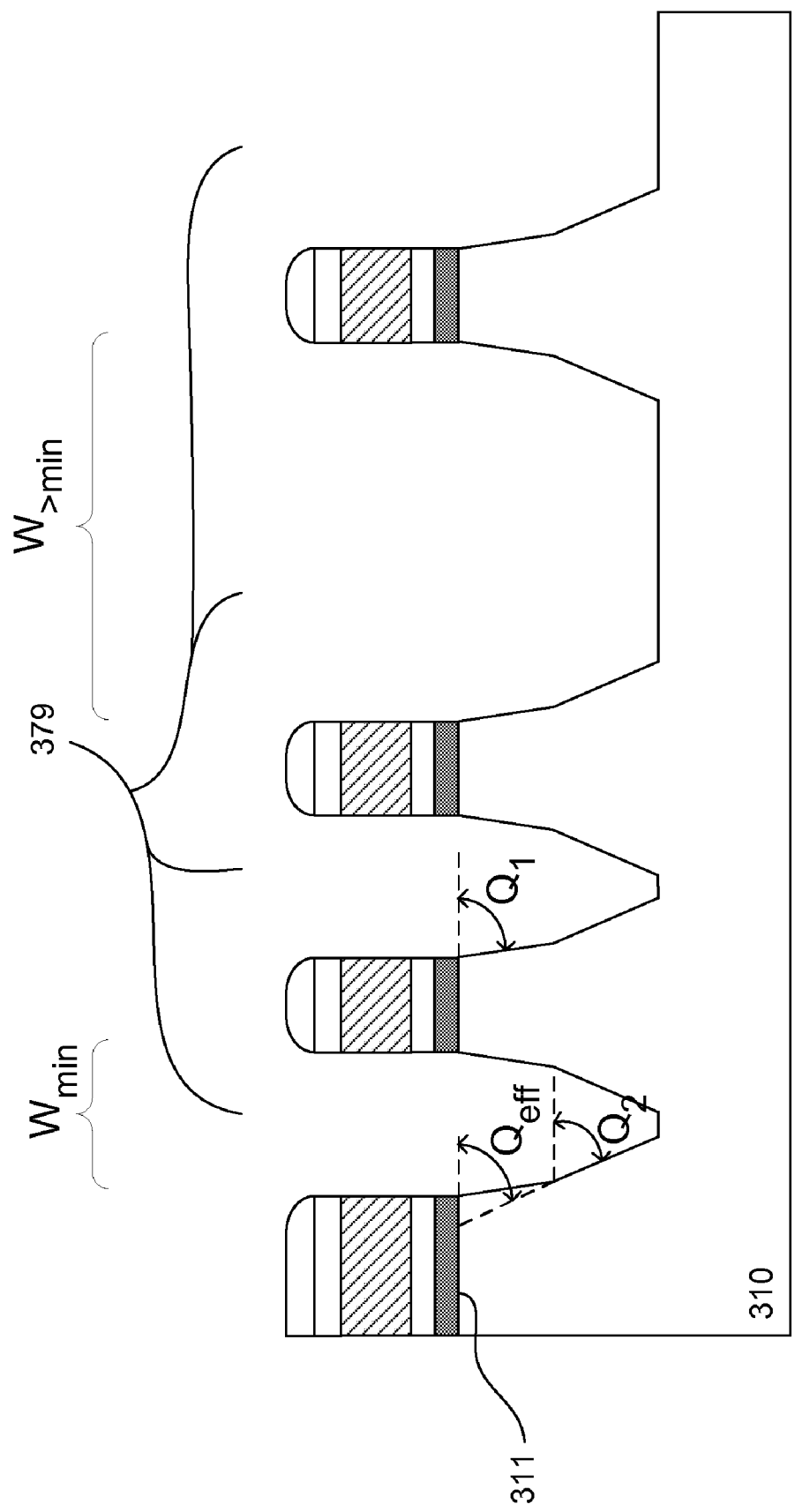

METHOD OF FORMING SHALLOW TRENCH ISOLATION STRUCTURES FOR INTEGRATED CIRCUITS

FIELD OF THE INVENTION

The present invention relates generally to semiconductor integrated circuits (ICs), and more particularly to shallow trench isolations.

BACKGROUND OF THE INVENTION

In integrated circuits (ICs), various devices such as transistors, resistors, inductors, capacitors and varactors are configured to achieve the desired function. These devices are electrically isolated to ensure that they operate independently without interfering with each other. This can be achieved by forming isolation regions to prevent carriers from moving between neighboring semiconductor components.

To electrically isolate devices on the substrate, shallow trench isolations (STIs) are typically employed. STIs are formed by etching trenches in the substrate and filling them with a dielectric material. To facilitate filling high aspect ratio trenches, tapered or slanted sidewalls are used. The smaller the angle of the tapered sidewalls (or the more slanted the sidewalls), the easier it is to fill the trench. With current ground rules (GRs) and depth requirements, etching trenches with a desired angle Q results in a merged or pinched bottom surface 108, as shown in FIG. 1a.

As indicated by FIG. 1b, a trench having a width of 70 nm and a depth of 280 nm would merge at a tapered angle of less than 84°. In order to have a bottom surface, the angle needs to be greater than 84°. For example, the bottom surface would be 15 nm wide for Q of 84.5°, 30 nm wide for Q of 86° and 45 nm wide for Q of 87.5°. Furthermore, with Q of less than 84°, the depth of the trench decreases due to pinching of the sidewalls at shallower depths. The bottom surface of the STIs is where the n-well and p-well implant intersect. Pinching the bottom surface leaves little margin for overlay, limits the angle that can be achieved for a given depth or limits the trench depth. These issues can result in current leakage issues which degrade performance and/or reliability.

From the foregoing discussion, it is desirable to provide STIs with a tapered profile and flatter bottom.

SUMMARY OF THE INVENTION

The present invention relates to ICs. More particularly, the invention relates to a method of forming an integrated circuit. The method includes providing a substrate prepared with a patterned mask with an opening. The substrate is etched to form an upper portion of a trench structure in the substrate exposed by the opening. The upper portion of the trench structure comprises sidewalls with a first angle $Q_1$ with respect to a substrate surface. The substrate is further etched to form a lower portion of the trench, wherein the lower portion comprises a second angle $Q_2$, wherein $Q_2$ is less than $Q_1$. The method further includes filling the trench with a dielectric material in another embodiment of the invention.

An integrated circuit is presented in one aspect of the invention. The integrated circuit comprises a substrate having a trench and an opening of a width W. The trench includes upper and lower portions with sidewall profile of the trench in the upper portion having a tapered angle $Q_1$ and a tapered angle $Q_2$ for the lower portion, wherein $Q_2$ is less than $Q_1$. The integrated circuit further includes a dielectric material in the trench.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 3a-f show a process for forming STI structures in accordance with one embodiment of the invention.

DETAILED DESCRIPTION OF THE INVENTION

The present invention relates to filling structures, such as gaps or trenches. The structures, for example, are used in integrated circuits (ICs). Typically, the structures are high aspect ratio structures. In one embodiment, the structures correspond to STIs in ICs. The ICs can be any type of IC.

Figure 1A:
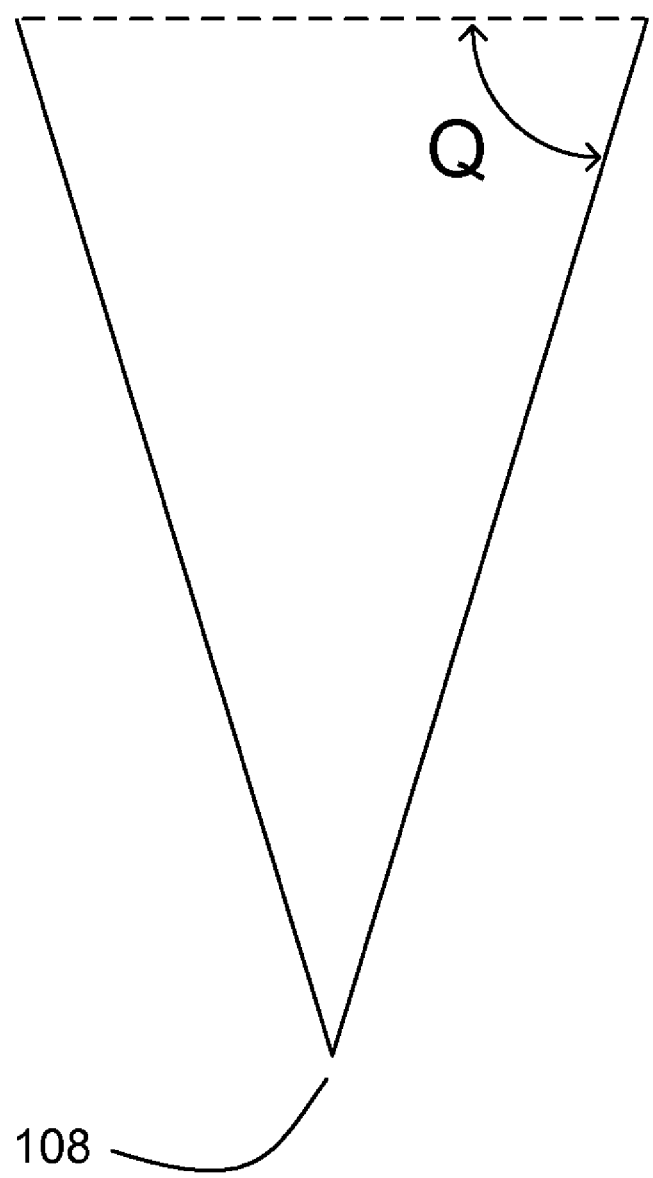
FIGS. 1a-b show conventional STI structures.
Figure 1B:
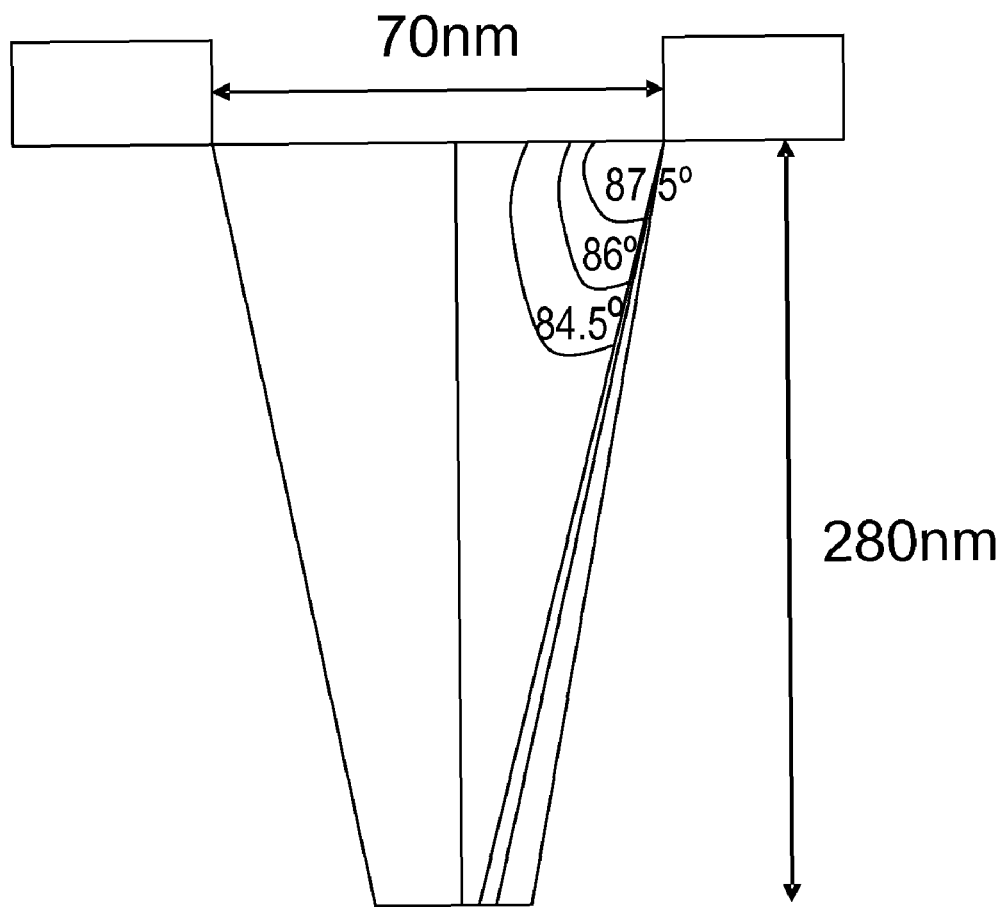
Figure 2:
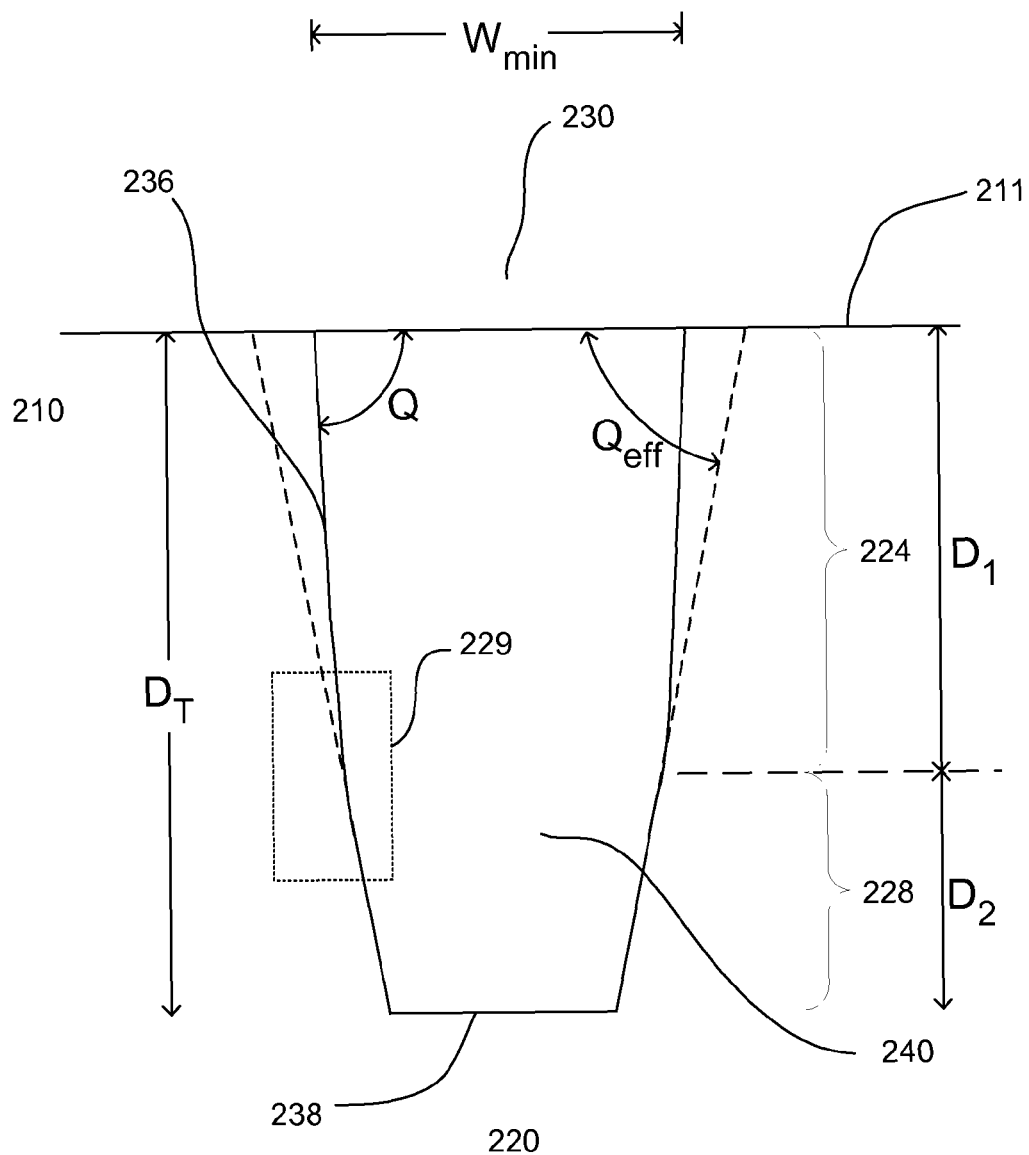
FIG. 2 shows an STI structure in accordance with one embodiment of the invention.

FIG. 2 shows an STI structure 220 in accordance with one embodiment of the invention. The STI structure comprises a trench 230 formed in a substrate 210, such as a silicon substrate. Other types of substrates are also useful. The STI structure is formed, for example, around an active area of a device to isolate it from other device active areas. The trench, in one embodiment, comprises a high aspect ratio trench. The trench is filled with a dielectric material 240, such as silicon oxide. The silicon oxide can be formed by, for example, high density plasma (HDP) processes. Other types of dielectric materials are also useful. For example, dielectric materials which can fill high aspect ratio structures, such as high aspect ratio process (HARP) material from Applied Materials, Inc., can be used.

Typically, STI structures within an IC can have different widths, depending on design requirements. For example, the IC includes STI structures having minimum widths ($W_{min}$) in densely packed (nested) device areas and wider widths ($W_{>min}$) in less densely packed (iso) device areas. Generally, $W_{min}$ depends on the GR. For example, $W_{min}$ can be equal to the GR. In the case where GR is equal to 70 nm, then $W_{min}$ would be equal to 70 nm. Other values of $W_{min}$ can also be employed. For example, $W_{min}$ can be less than GR.

As shown, the STI structure of the IC comprises a width equal to $W_{min}$. The trench comprises a depth $D_T$ from a surface 211 of the substrate. The depth should be sufficient to prevent punch through in the device. Typically, $D_T$ is about 2500-3000 Å. Other depths are also useful, depending on, for example, design requirements. In one embodiment, the trench comprises a high aspect ratio trench. In one embodiment, the aspect ratio of the trench is at least about 6:1. Providing other aspect ratios is also useful.

The profile of the trench sidewall 236 comprises different tapered angles in the upper and lower portions. In one embodiment, the upper portion comprises a tapered angle Q and the lower portion comprises a tapered angle less than Q. The tapered angle at the lower portion should be sufficient to facilitate filling the trench. This results in the trench having a sidewall profile with an effective angle $Q_{eff}$ which is less than Q. In one embodiment, $Q_{eff}$ can be equal to the tapered angle of the lower portion of the trench. Other trench sidewall profiles, such as one in which Q gradually decreases with depth to produce the desired $Q_{eff}$ is also useful. In one embodiment, $Q_{eff}$ is less than about 88°. For example, $Q_{eff}$ is equal to about 82-88°. Preferably, $Q_{eff}$ is equal to about 83-87°. More preferably, $Q_{eff}$ is equal to about 83-84.5°. In one embodiment, $Q_{eff}$ is equal to about 84.5°±1.5°. Other $Q_{eff}$ angles which facilitate filling of the trenches are also useful. For example, angles less than 82° or more than 88° can also be used.

In accordance with one embodiment, the trench comprises upper and lower portions 224 and 228. The upper portion comprises a depth $D_1$ while the lower portion comprises a depth $D_2$, wherein $D_1+D_2$ equals to $D_T$. In one embodiment, $D_1$ is about 40-80% of $D_T$. Preferably, $D_1$ is greater than $D_2$. In one embodiment, $D_1$ is about greater than 50% to about 80% of $D_T$ or to about 70% of $D_T$. In another embodiment, $D_1$ is about 60-70% of $D_T$. The upper portion should be sufficiently deep to enable the lower portion to have the desired $Q_{eff}$. Preferably, the upper portion should be sufficiently deep to enable the lower portion to have the desired $Q_{eff}$ without pinching the bottom of the trench. In another embodiment, the upper portion should be as deep as possible to enable the lower portion to have the desired $Q_{eff}$. A transition region 229 between the upper and lower portions should be smooth. The smooth transition between the two portions avoids hindering or interfering with filling of the trenches.

As described, a structure having upper and lower portions with different angles is provided. Having different angles for upper and lower portions provides advantages over conventional STI structures. For example, a lower $Q_{eff}$ for a given $W_{min}$ can be achieved without pinching the bottom surface. The lower $Q_{eff}$ improves filling of the trenches. Also, a flatter bottom surface 238 is produced since no pinching occurs as well as deeper trenches with the desired $Q_{eff}$ for a given $W_{min}$ can be achieved, which result in improved isolation performance, reliability and process window.

Figure 3A:
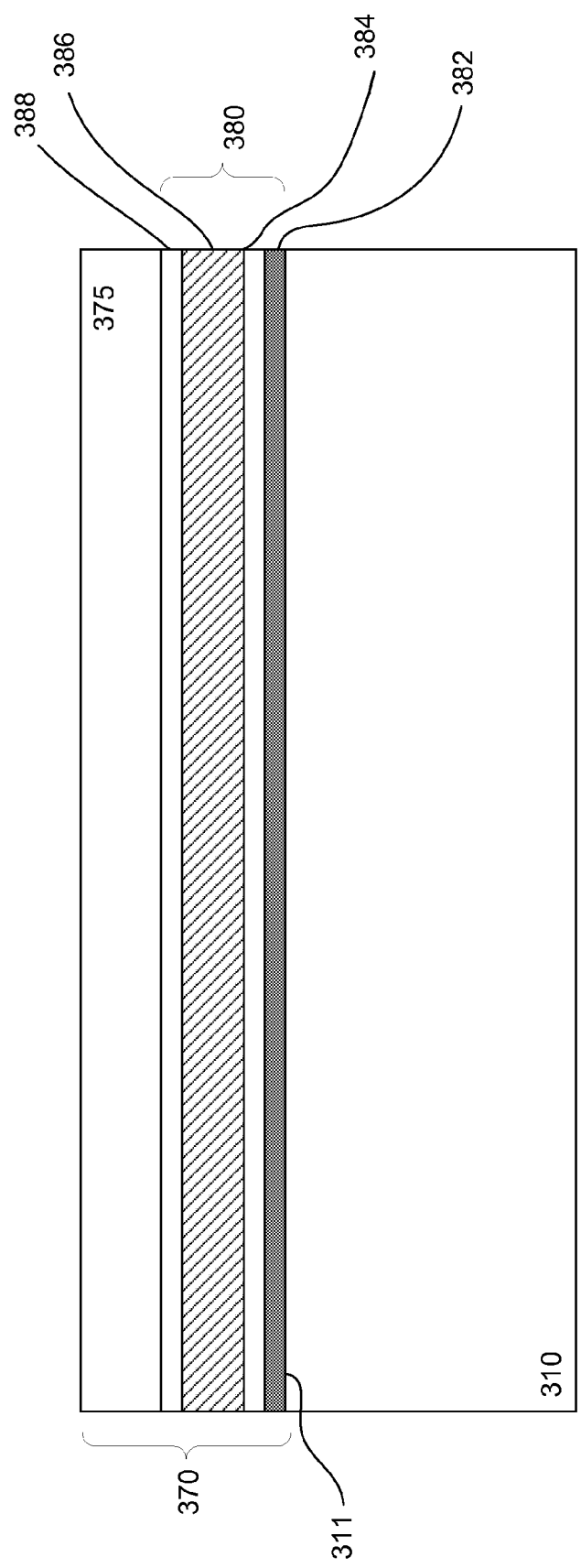

FIGS. 3a-f show cross-sectional views showing a process for forming STI structures in accordance with one embodiment of the invention. Referring to FIG. 3a, a substrate 310 is provided on which the IC is formed. Typically, the substrate comprises silicon. Other types of substrates, such as those having an epitaxial (epi) silicon layer, are also useful. In one embodiment, the substrate is at the stage of processing just prior to forming STI structures. The substrate is prepared with a mask layer 370. The mask layer, for example, comprises a hard mask 380 and a soft mask 375. The soft mask, for example, comprises photoresist. The soft mask has a thickness of about 2000 Å. Other thicknesses are also useful. Various techniques, such as spin-on, can be used to form the soft mask layer.

As shown, the hard mask comprises a hard mask stack with a plurality of layers. The hard mask stack, in one embodiment, includes a pad layer 382 and a first or primary hard mask layer 384. The pad layer is formed on the substrate surface 311. The pad layer serves to provide adhesion and relieve mechanical stress caused by mismatches between coefficients of thermal expansion of the substrate and overlying layers. Typically, the pad layer comprises silicon oxide formed by, for example, thermal oxidation such as rapid thermal oxidation (RTP). The thickness of the pad, for example, is about 1000-1300 Å.

Other materials and deposition processes can also be useful. The primary hard mask layer comprises a material which can be etched selectively to the substrate. Preferably, the hard mask layer comprises a material which can be etched selectively to the substrate as well as serving as a polish stop for the fill material. In one embodiment, the first hard mask layer can comprise silicon nitride. Various deposition techniques, such as chemical vapor deposition (CVD), can be employed.

Optionally, the hard mask stack can include a second or intermediate hard mask layer 386. The second hard mask layer serves to reduce reflection due to the first hard mask. If suppression of reflectivity due to the first hard mask is not required, the second hard mask layer can be omitted. The second hard mask layer comprises, for example, a bottom anti-reflective coating (BARC) layer, such as an organic material including polyimide or a polysulfone. The thickness of the BARC layer can be about 2000 Å. The second hard mask layer can be formed using various conventional processes. An antireflective coating (ARC) layer 388 is typically provided below the soft mask layer. The ARC layer is used to reduce reflection during exposure, which can impair the quality of the image being patterned. The ARC layer comprises, for example, an organic polymer having a thickness of about 1000 Å. Other types of materials are also useful.

Figure 3B:
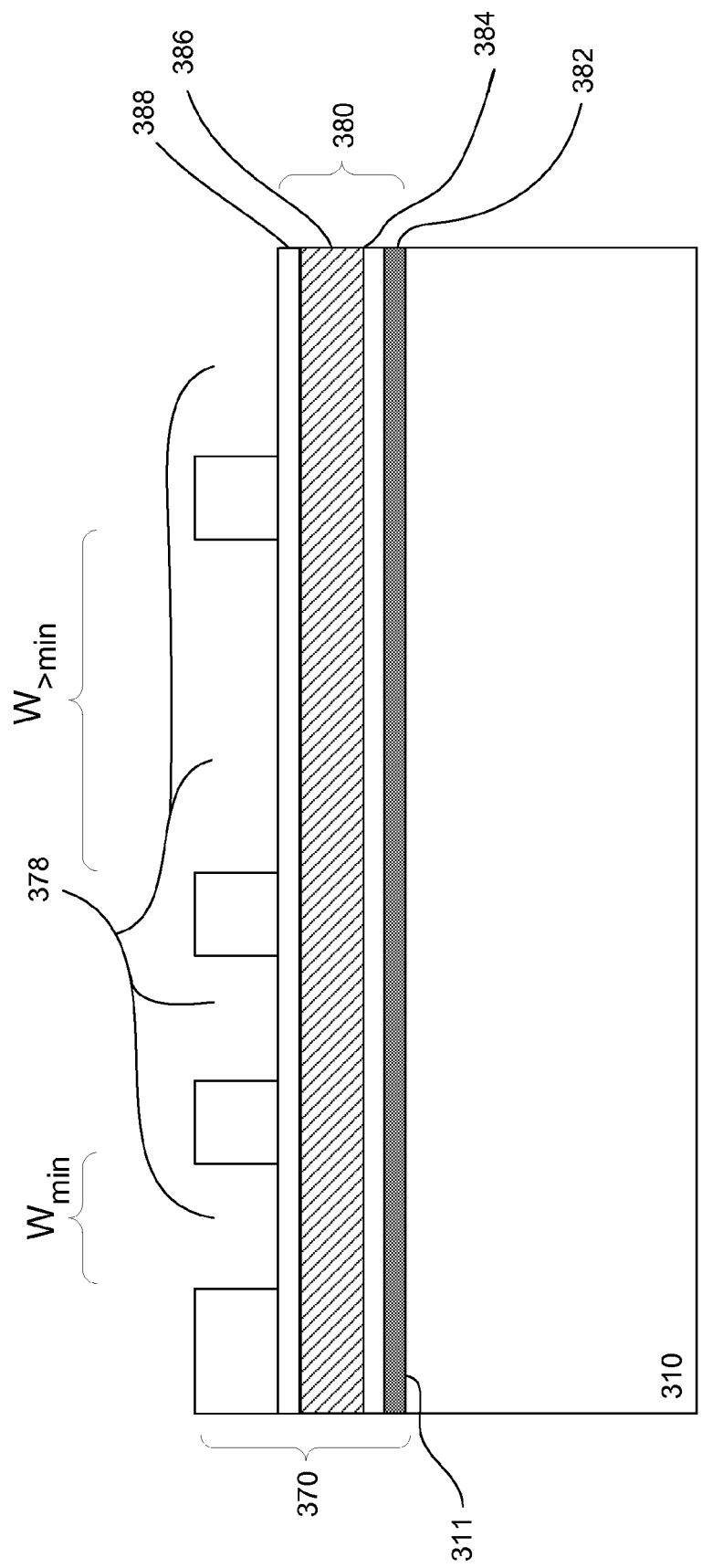

Referring to FIG. 3b, the soft mask is patterned to create openings 378 corresponding to locations where STI trenches are to be formed. Patterning the resist layer includes exposing portions of the resist to an exposure source through a mask and developing it to remove exposed or unexposed portions, depending on whether a positive or negative resist is used. The openings in the soft mask layer expose portions of the hard mask stack. In one embodiment, openings have different widths. For example, openings in densely packed device regions will have a minimum width $W_{min}$ while openings in less densely packed device regions will have a width greater than $W_{min}$ ($W_{>min}$). $W_{min}$ can be, for example, equal to about GR. Other values of $W_{min}$, such as less than GR, is also useful.

Figure 3C:
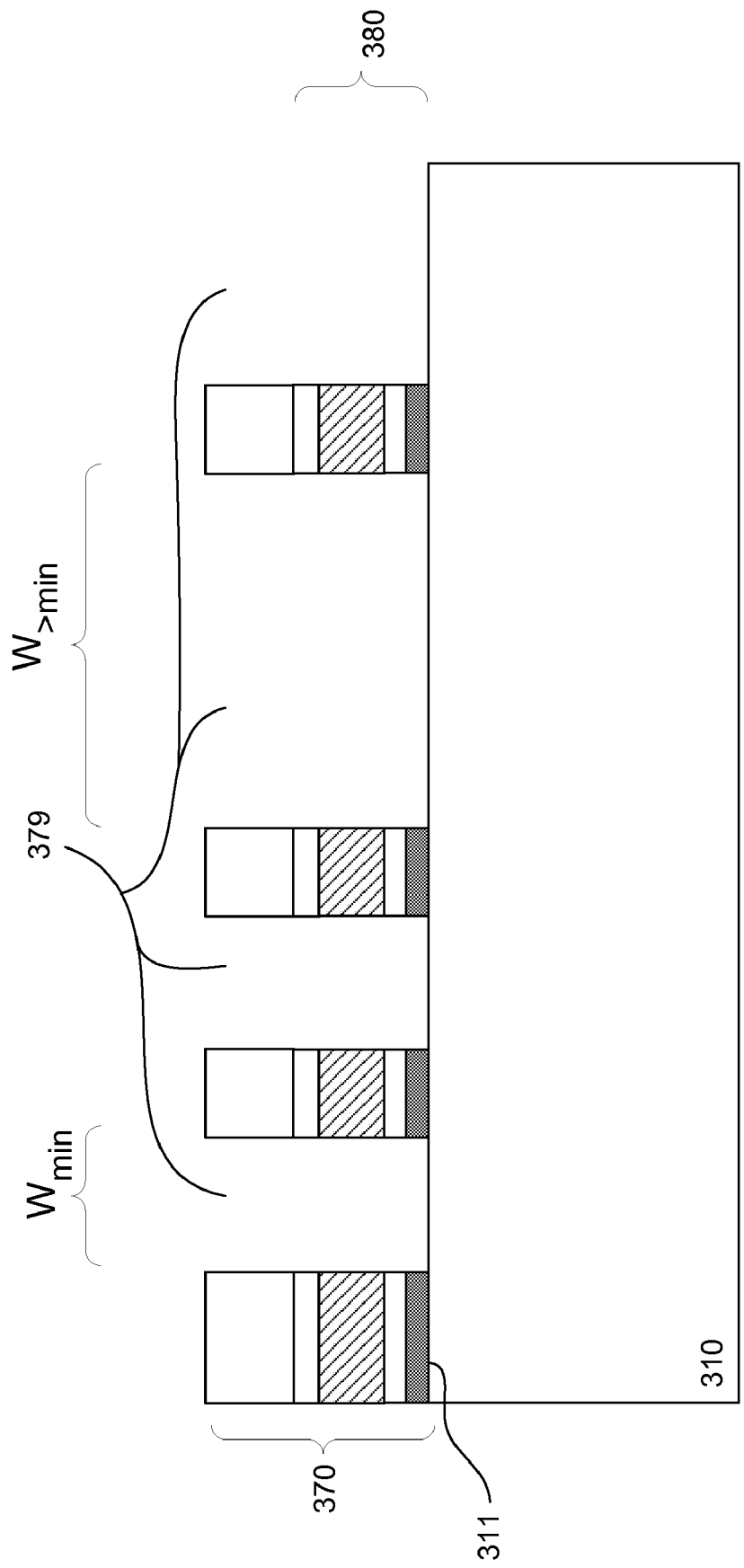

In FIG. 3c, hard mask stack is patterned, removing portions exposed by the soft mask. As such, the pattern of the soft mask is transferred to the hard mask stack. The patterned hard mask stack forms openings 379, exposing the substrate surface. Patterning of the hard mask stack is achieved by, for example, an anisotropic etch, such as reactive ion etching (RIE).

Figure 3D:
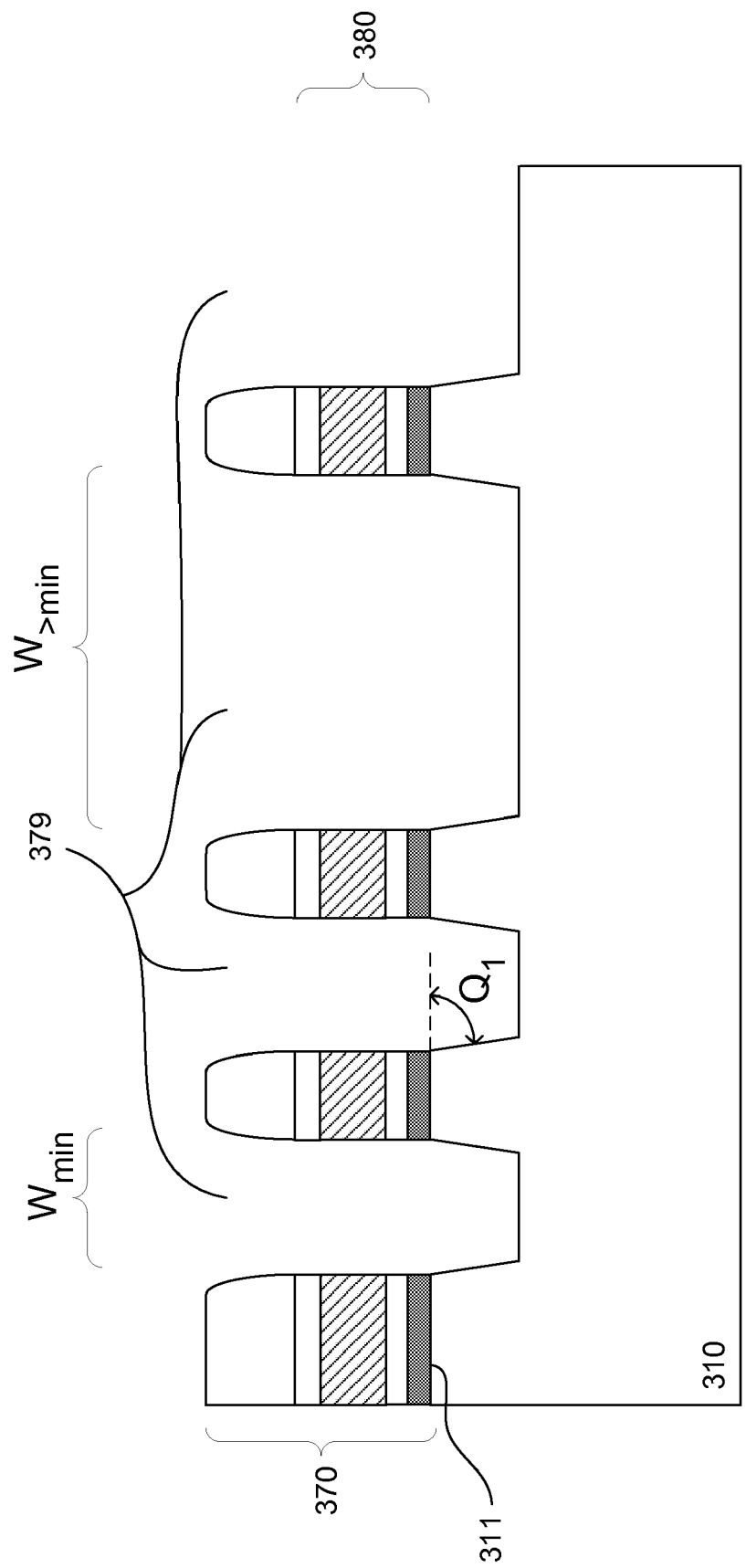

The process continues to form trenches in the substrate. In accordance with one embodiment of the invention, a multi-step etch process is employed to form the trenches. In one embodiment, the multi-step etch process comprises first and second etch steps. Referring to FIG. 3d, the first etch step is performed to partially form trenches in regions unprotected by the hard mask stack. The first etch forms first or upper portions of the trenches having a first depth $D_1$. The first etch step comprises a selective anisotropic etch, such as RIE. In one embodiment, the anisotropic etch is selective to the mask layer. The etch selectivity of substrate to mask layer, for example, is about 10:1 to 20:1 (for e.g., etch rate of substrate is 10 to 20 times that of the mask material). Higher etch selectively allows the use of a thinner mask layer. Preferably, the etch selectivity of the first etch is at least 10:1 with respect to the mask.

In one embodiment, the sidewalls of the upper portion of the trenches comprise a first angle $Q_1$ (at least with respect to the trenches with width=$W_{min}$). The etch employs a polymerizing chemistry. The first etch, for example, employs a hydrogen bromide/oxygen ($HBr/O_2$). Other types of chemistry which etches the substrate with the desired etch selectivity is also useful. For example, chlorine/oxygen ($Cl_2/O_2$) can also be used in the first etch step. The polymerizing chemistry is employed to passivate the sidewalls to achieve the desired angle $Q_1$.

In FIG. 3e, the second etch is performed to form lower portions to complete the trenches. The lower portion of the trenches comprises a depth $D_2$, wherein $D_1+D_2=D_T$. The second etch forms trenches in which the sidewall profile comprises a sidewall angle $Q_2$ in the lower portion. In one embodiment, $Q_2$ is less than $Q_1$. The angle $Q_2$ should be sufficient to facilitate filling the trench. This results in the trench having a sidewall profile with an effective angle $Q_{eff}$ which is less than $Q_1$. In one embodiment, $Q_{eff}$ can be equal to $Q_2$. In one embodiment, $Q_2$ is less than about 88°. For example, $Q_2$ is equal to about 82-88°. Preferably, $Q_2$ is equal to about 83-87°. More preferably, $Q_2$ is equal to about 83-84.5°. In one embodiment, $Q_2$ is equal to about 84.5°+1.5°. Other $Q_2$ angles which facilitate filling of the trenches are also useful. For example, angles less than 82° or more than 88° can also be used. Other trench sidewall profiles, such as one in which Q gradually decreases with depth to produce the desired $Q_2$ or $Q_{eff}$ is also useful.

The second etch comprises an anisotropic etch, such as RIE. In one embodiment, the second etch comprises a non-selective anisotropic etch with respect to the mask layer. The non-selective etch has an etch selectivity of the substrate to the mask that is about, for example, 1:1 to 3:1. Furthermore, the second etch comprises a less polymerizing etch than the first etch to produce a single sloping sidewall profile in the lower portion with a flat or substantially flat bottom surface. In one embodiment, the non-selective etch chemistry comprises carbon tetrafluoride/octafluorocyclobutane/nitrogen ($CF_4/C_4F_8/N_2$). Other types of non-selective chemistries, such as sulfur hexafluoride/helium/carbon tetrafluoride ($SF_6/He/CF_4$), are also useful.

In accordance with one embodiment, $D_1$ is about 40-80% of $D_T$. Preferably, $D_1$ is greater than $D_2$. In one embodiment, $D_1$ is about greater than 50% to about 80% of $D_T$ or to about 70% of $D_T$. In another embodiment, $D_1$ is about 60% to 70% of $D_T$. The upper portion should be sufficiently deep to enable the lower portion to have the desired $Q_{eff}$. Preferably, the upper portion should be sufficiently deep to enable the lower portion to have the desired $Q_{eff}$ without pinching the bottom of the trench. In another embodiment, the upper portion should be as deep as possible to enable the lower portion to have the desired $Q_{eff}$. The transition between $D_1$ and $D_2$ should be smooth. The smooth transition avoids hindering or interfering with filling of the trenches.

As described, the soft mask remains during etching of the trenches. The soft mask gets eroded during the non-selective etch of the lower portion of the trench. Depending on the thickness of the soft mask, it may be completely or partially eroded. In the case of complete erosion of the soft mask, the exposed hard mask may also get partially eroded. There should be sufficient amount of hard mask (e.g., silicon nitride) remaining to serve as a polish stop for subsequent processes. By not removing the soft mask, a thinner hard mask layer can be used. In alternative embodiments, the soft mask may be removed prior to etching of the substrate to form the trenches.

Figure 3F:
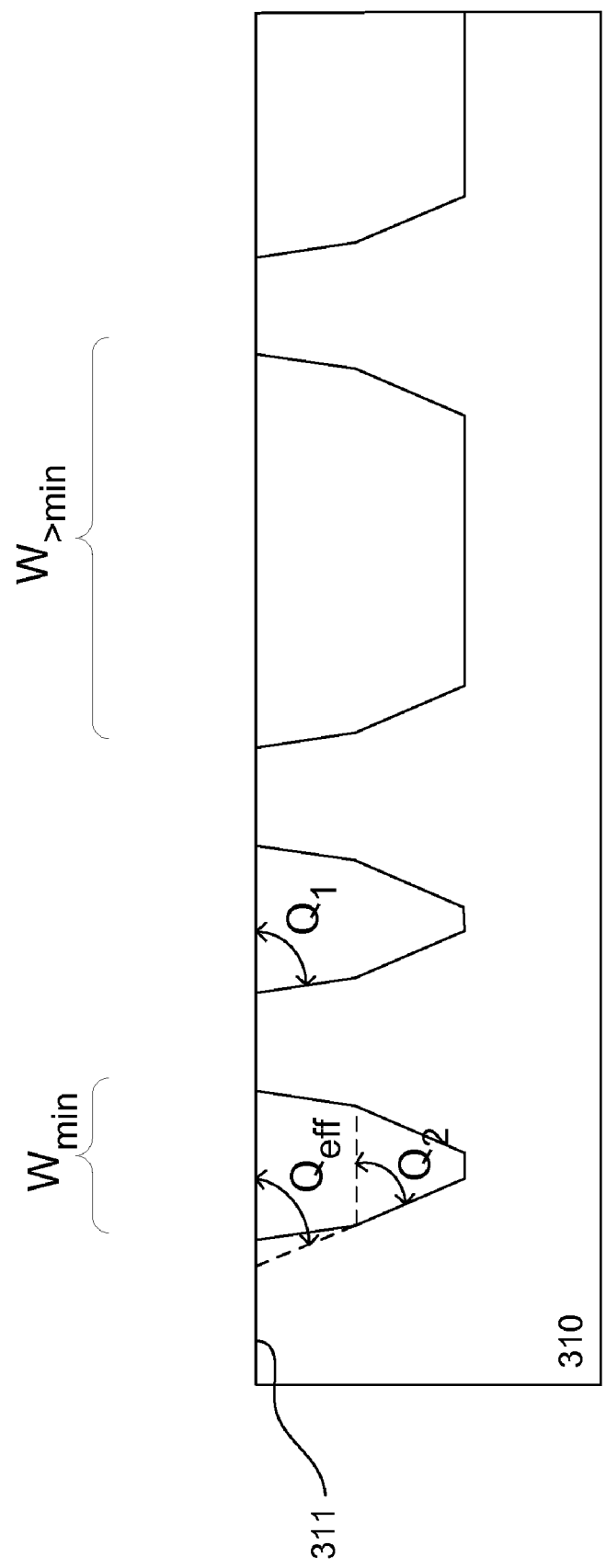

The process continues to complete the STI structures by filling the trenches with a dielectric material, as shown in FIG. 3f. For example, a liner layer can be formed on the substrate, lining the trench sidewalls to relieve stress and repair etching damage to the silicon substrate. The liner, for example, comprises silicon oxide. The liner can be formed by, for example, silicon oxynitride (SiON) or a $Si_3N_4/SiO_2$ hybrid. An insulating layer is then deposited on the substrate, filling the trenches. In one embodiment, the insulating layer comprises a HARP material, such as $SiO_2$. Other types of insulating materials are also useful. Excess insulating material is removed by, for example, chemical mechanical polishing (CMP), producing STI structures having top surfaces coplanar with the substrate surface. After the STI structures are completed, processing of the substrate continues to complete the IC.

Figure 4A:
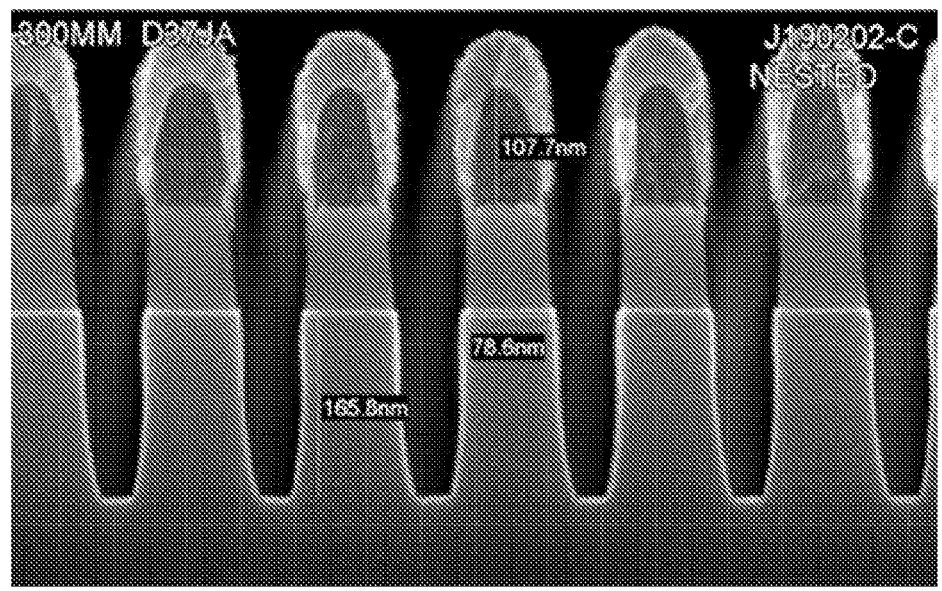
FIGS. 4a-b show Scanning Electron Microscope (SEM) images of STI structures formed in accordance with one embodiment of the invention.
Figure 4B:
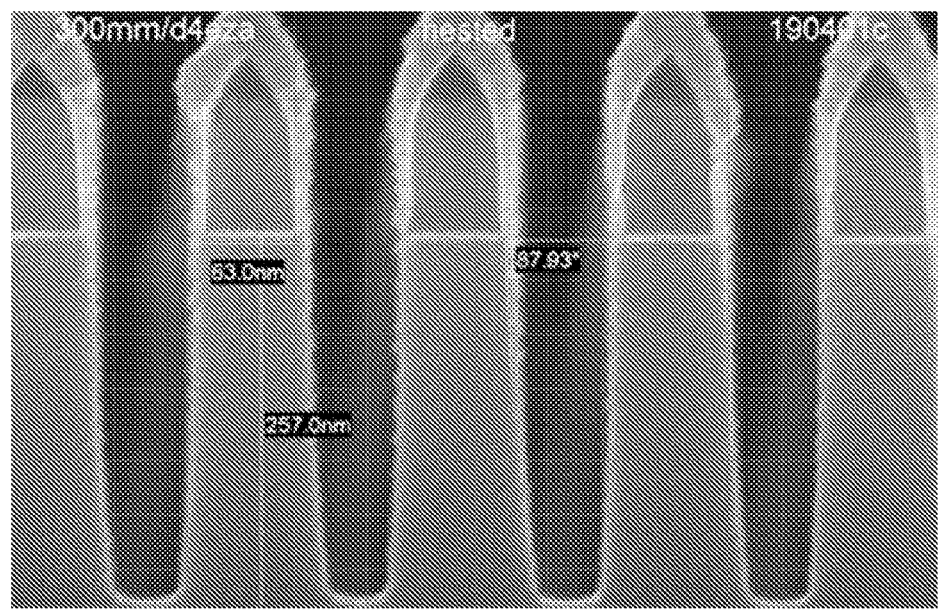

FIGS. 4a-b are SEM images of STI structures formed in accordance with one embodiment of the invention. Referring to FIG. 4a, partial trenches are formed on the substrate by a first selective anisotropic etch. As shown, the trenches are formed in nested or densely packed device region of the substrate. The trenches were etched to a depth of about 165.8 nm, about 65% of the total depth of 257 nm. The trench etch was performed with the resist layer remaining on top of the hard mask stack. Referring to FIG. 4b, completed trenches are shown after a second non-selective anisotropic etch. As shown, the trenches have sidewalls with a tapered angle of about 87.93° and flat bottom surface, which are desirable for HARP.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming an integrated circuit comprising:
   providing a substrate prepared with a patterned mask with an opening;
   etching the substrate to form an upper portion of a trench structure in the substrate exposed by the opening, the upper portion of the trench structure is from a top surface of the substrate, the upper portion comprising sidewalls with a first angle $Q_1$ with respect to the top surface of the substrate, wherein the etching comprises an anisotropic etch selective to the patterned mask;
   further etching the substrate to form a lower portion of the trench below the upper portion, wherein the lower portion comprises a second angle $Q_2$ with respect to the top surface of the substrate, wherein the formed trench has the angle $Q_1$ in the upper portion and the angle $Q_2$ in the lower portion, wherein $Q_2$ is less than $Q_1$, wherein the further etching comprises an anisotropic etch non-selective to the patterned mask; and
   filling the trench with dielectric material.

2. The method of claim 1 wherein the patterned mask comprises a soft mask and a hard mask.

3. The method of claim 1 wherein filling the trench with dielectric material forms a shallow trench isolation (STI).

4. The method of claim 1 wherein having $Q_2$ less than $Q_1$ enables the trench to have a lower effective Q ($Q_{eff}$) to improve filling.

5. The method of claim 1 wherein:
   a depth of trench is equal to $D_T$;
   a depth of the upper portion is equal to $D_1$; and
   a depth of the lower portion is equal to $D_2$, wherein $D_1$ is greater than $D_2$.

6. The method of claim 1 wherein the upper and lower portions are contiguous portions.

7. The method of claim 2 wherein the soft mask remains during etching of the substrate.

8. The method of claim 2 wherein having $Q_2$ less than $Q_1$ enables the trench to have a lower effective Q ($Q_{eff}$) to improve filling.

9. The method of claim 3 wherein:
the mask comprises a soft mask and a hard mask.

10. The method of claim 3 wherein filling the trench comprises filling with a high aspect ratio process dielectric material.

11. The method of claim 4 wherein $Q_{eff}$ is equal to less than about 88°.

12. The method of claim 5 wherein having $Q_2$ less than $Q_1$ enables the trench to have a lower effective Q ($Q_{eff}$) to improve filling.

13. The method of claim 10 wherein:
etching the substrate comprises an anisotropic etch selective to the patterned mask at an etch selectivity of 10:1 with respect to the mask;
further etching the substrate comprises an anisotropic etch non-selective to the patterned mask at an etch selectivity of 1:1 to 3:1 with respect to the mask; and
the mask comprises a soft mask and a hard mask.

14. The method of claim 11 wherein $Q_{eff}$ is equal to about 82-88°.

15. The method of claim 12 wherein $D_1$ is greater than 50% to about 80% of $D_T$.

16. A method of forming an isolation trench comprising:
providing a substrate prepared with a patterned mask with an opening;
etching the substrate to form an upper portion of a trench structure in the substrate exposed by the opening, the upper portion is from a top surface of the substrate, the etch to form the upper portion employs a polymerizing chemistry to passivate sidewalls of the upper portion to form passivated upper sidewalls in the upper portion having a first angle $Q_1$ with respect to the top surface of the substrate, wherein etching the substrate comprises an anisotropic etch selective to the patterned mask;
further etching the substrate to form a lower portion of the trench below the upper portion, wherein the lower portion comprises lower sidewalls having a second angle $Q_2$ with respect to the top surface of the substrate in which $Q_2$ is less than $Q_1$, wherein the passivated upper sidewalls maintain $Q_1$ when forming the lower portion, wherein further etching the substrate comprises an anisotropic etch non-selective to the patterned mask; and
filling the trench with a high aspect ratio process dielectric material.

17. The method of claim 16 wherein the upper and lower portions are contiguous portions.

18. The method of claim 16 wherein the patterned mask comprises a soft mask and a hard mask.

19. The method of claim 16 wherein:
etching the substrate comprises an anisotropic etch selective to the patterned mask at an etch selectivity of 10:1 with respect to the mask;
further etching the substrate comprises an anisotropic etch non-selective to the patterned mask at an etch selectivity of 1:1 to 3:1 with respect to the mask; and
the mask comprises a soft mask and a hard mask.

20. The method of claim 16 wherein having $Q_2$ less than $Q_1$ enables the trench to have a lower effective Q ($Q_{eff}$) to improve filling.

21. The method of claim 18 wherein the soft mask remains during etching of the substrate.

22. The method of claim 20 wherein $Q_{eff}$ is equal to less than about 88°.

23. The method of claim 2 wherein $Q_{eff}$ is equal to about 82-88°.

* * * * *